United States Patent
Loo et al.

(10) Patent No.: US 10,018,668 B2
(45) Date of Patent: Jul. 10, 2018

(54) KILL DIE SUBROUTINE AT PROBE FOR REDUCING PARAMETRIC FAILING DEVICES AT PACKAGE TEST

(71) Applicant: Texas Instruments Incorporated, Dallas, TX (US)

(72) Inventors: Hoi Hin Loo, Kuala Lumpur (MY); Soh Ying Seah, Negeri Sembilan (MY)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/713,111

(22) Filed: Sep. 22, 2017

(65) Prior Publication Data

US 2018/0011138 A1    Jan. 11, 2018

Related U.S. Application Data

(63) Continuation of application No. 14/168,648, filed on Jan. 30, 2014, now Pat. No. 9,772,372.

(51) Int. Cl.
*G01R 31/28* (2006.01)

(52) U.S. Cl.
CPC ........ *G01R 31/2851* (2013.01); *G01R 31/287* (2013.01); *G01R 31/2853* (2013.01); *G01R 31/2894* (2013.01)

(58) Field of Classification Search
CPC .............. G01R 31/287; G01R 31/2853; G01R 31/2894
See application file for complete search history.

(56) References Cited

U.S. PATENT DOCUMENTS

| | | |
|---|---|---|
| 5,286,656 A | 2/1994 | Keown et al. |
| 5,469,064 A | 11/1995 | Kerschner et al. |
| 5,759,428 A | 6/1998 | Balamane et al. |
| 5,790,565 A | 8/1998 | Sakaguchi |
| 5,930,588 A | 7/1999 | Paniccia |
| 6,210,983 B1 | 4/2001 | Atchison et al. |
| 6,347,379 B1 | 4/2002 | Walker et al. |
| 6,522,159 B1 | 2/2003 | Nishide |
| 6,933,591 B1 | 8/2005 | Sidhu et al. |
| 7,129,735 B2 | 10/2006 | Subramaniam et al. |
| 7,424,654 B2 | 9/2008 | Burke et al. |
| 7,519,882 B2 | 4/2009 | Debenham |
| 2001/0017878 A1 | 8/2001 | Nozoe et al. |

(Continued)

*Primary Examiner* — Giovanni Astacio-Oquendo
*Assistant Examiner* — Alvaro Fortich
(74) *Attorney, Agent, or Firm* — Ronald O. Neerings; Charles A. Brill; Frank D. Cimino

(57) ABSTRACT

A method of testing semiconductor devices includes contacting bond pads coupled to integrated circuitry on a first die of a plurality of interconnected die on a substrate using a probe system having probes and probe tests including parametric tests, continuity tests, and a kill die subroutine. Probe tests using the probe program are performed. Die are binned into a first bin (Bin 1 die) for being a good die for all probe tests, or a second bin (Bin 2 die) for failing at least one of continuity tests and parametric tests. The Bin 2 die are divided into a first sub-group that failed the continuity tests and a second sub-group that do not fail the continuity tests. A kill die subroutine is triggered including applying power sufficient to selectively cause damage to the second sub-group of Bin 2 die to generate a continuity failure and thus generate kill die.

20 Claims, 3 Drawing Sheets

(56) References Cited

U.S. PATENT DOCUMENTS

| | | |
|---|---|---|
| 2002/0145434 A1 | 10/2002 | Eddy et al. |
| 2003/0117162 A1* | 6/2003 | Watts ................. G01R 31/2851 324/757.04 |
| 2003/0169064 A1 | 9/2003 | Pirkle et al. |
| 2004/0041167 A1 | 3/2004 | Marr et al. |
| 2004/0243949 A1 | 12/2004 | Wang et al. |
| 2005/0208684 A1 | 9/2005 | Yamada et al. |
| 2006/0048031 A1 | 3/2006 | Aadsen et al. |
| 2007/0226552 A1 | 9/2007 | Kushiyama et al. |
| 2008/0030217 A1 | 2/2008 | Patel et al. |
| 2008/0052575 A1* | 2/2008 | Jang ................. G01R 31/31926 714/724 |
| 2009/0018793 A1* | 1/2009 | Sakarovitch ......... G05B 13/024 702/123 |
| 2010/0127729 A1 | 5/2010 | Zjajo |
| 2012/0109874 A1 | 5/2012 | Balog |
| 2012/0123734 A1 | 5/2012 | Linde et al. |
| 2014/0184262 A1 | 7/2014 | Poindexter et al. |

* cited by examiner

KILL DIE SUBROUTINE AT PROBE FOR REDUCING PARAMETRIC FAILING DEVICES AT PACKAGE TEST

CROSS REFERENCE TO RELATED APPLICATIONS

Under 35 U.S.C. § 120, this continuation application claims benefits of and priority to U.S. patent application Ser. No. 14/168,648 (TI-73314), filed on Jan. 30, 2014, the entirety of which are hereby incorporated herein by reference.

FIELD

Disclosed embodiments relate to electrical testing of semiconductor integrated circuit (IC) die including probe and package test.

BACKGROUND

Traditionally, wafer fabrication completed semiconductor devices in wafer form are probed, binned, singulated into discrete die, packaged, and then final package tested (final test). Many IC products have full probe test coverage with an extensive set of parametric tests including high complexity and high performance test parameters, including both DC parametric testing and AC parametric testing because the probe system has a low stepping time and is cheaper to operate as compared to a package test system. As used herein and used in the art, the term "parametric test" means the measurement and verification of terminal voltage and current characteristics at one or more device pins or pads of a semiconductor device. Moreover, with the wafer form, there is no jamming, relatively easy electrical contact, and the ability to generally handle large lot sizes.

Final package test (final test) is costly due to use of an expensive commercial tester and a handler. Final test is also device specific, which generally means an individual such as a technician has to reconfigure the setup (e.g., change to a new contactor) for the next device to be final tested. Final test is known to cause poor Overall Equipment Efficiency (OEE) that drives high final test cost, such as an OEE of about 30% to 40%, and can take about 1 sec per unit to complete the tests.

One known approach to reducing the final test cost is using a streamlined final test routine including a reduced number of parametric tests compared to the parametric tests performed at wafer probe. This means the high complexity and performance test parameters are performed only probe, so the streamlined final test routine does not repeat these tests. However, in the case of parametric shifts of the IC die between probe and the streamlined final test routine which includes assembly, since the high complexity and high performance test parameters are not performed in the streamlined approach, test escapes happen which are known to sometimes adversely impact product quality levels.

SUMMARY

Disclosed embodiments reflect the recognition die-picking problems can result in packaging of semiconductor die that should be rejected for parametric failure(s) at probe actually reaching final package test (hereafter "final test"). Moreover, disclosed embodiments recognize wafer map shifts in assembly can result in some die that pass all the parametric tests at probe can fail one or more of the same parametric tests if the limits at probe are the same at final test. Such packaged devices that should be rejected for parametrics can generally all be captured and then properly scrapped using a full coverage final test program including a variety of complex or device specific parametric tests, but not by a more streamlined final test routine because such a program emphasizes open, short and leakage tests, while most (if not all) of the complex or device specific parametric tests are only performed at probe to minimize final test cost. In this case, the streamlined final test routine does not have the capability to detect most parametric failures.

To solve this problem, disclosed embodiments include a kill die subroutine introduced into the probe program to transform the parametric failures at wafer probe (hereafter "probe") into continuity (open/short) failures so they can be captured by a streamlined final test routine that can include significantly fewer parametric tests, with a typical embodiment including only minimal DC parametric tests with no AC parametric tests, which can be compared to the wide variety of parametric tests performed at probe (both DC and AC parametric tests). The group of parametric failures at wafer probe subject to the kill die subroutine can also include die that evidence parametrics that pass all parametric tests based on final test parametric limits, by adding a guardband to one or more parametric limits at probe to account for predetermined assembly shifts in the parametrics. One specific example of a disclosed streamlined final test routine is an assembly checker (ACHK) program that exclusively (only) performs DC tests (e.g., continuity and leakage, with some minimal DC parametric tests with no AC parametric tests) having a total test time of about 50 ms.

The disclosed kill die approach at probe ensures parametric die rejects even if they get packaged will not escape from a streamlined final test routine such as a disclosed ACHK. The kill die subroutine ensures all parametric rejects are damaged sufficiently to generate continuity (open/short) failures. In one particular embodiment, the kill die routine can invoke high electrical power across selected device pad/terminal combinations to intentionally damage an ESD diode that may be included on the IC. However, no specific device structure is needed to implement the disclosed kill die approach at probe.

One typical method to generate kill die is to apply both high voltage and high current (high power) that exceeds the absolute ratings of the device to result in permanent damage to the device. For example, damage to conducting lines (e.g. metal lines), or dielectrics (e.g., gate dielectrics in the case of a metal-oxide-semiconductor (MOS) devices) that cause continuity failures when electrically overstressed that become opens or shorts can be readily detectable at final test.

DETAILED DESCRIPTION

Figure 1:
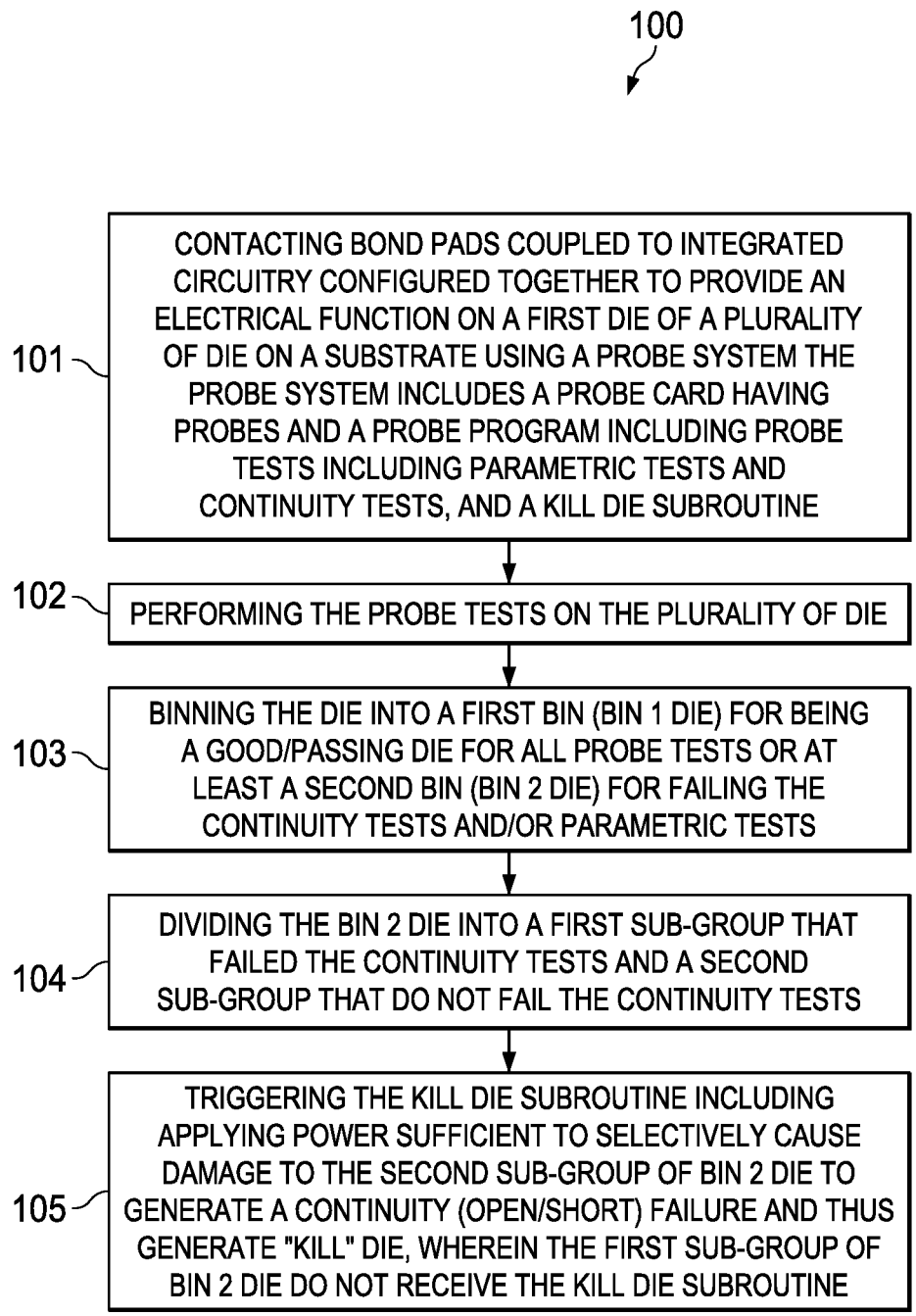
FIG. 1 is a flow chart for a method of testing semiconductor devices including a disclosed kill die subroutine for causing parametric failing die at probe to become continuity failures, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

FIG. 1 is a depiction of a flow chart of an example method 100 of testing semiconductor devices. Step 101 comprises contacting bond pads coupled to integrated circuitry of an IC configured together to provide an electrical function on a substrate (e.g., a wafer) having a plurality of interconnected die using a probe system. The probe system can be a conventional probe system including a device specific probe card having a plurality of probes and a device specific probe program including probe tests including continuity tests, a variety of parametric tests, and a disclosed kill die subroutine. The probe system also includes a processor, such as a digital signal processor (DSP) or microcontroller unit (MCU) that includes one or more associated memories.

Step 102 comprises performing the probe tests of the probe program on the plurality of die. A variety of parametric tests are generally included, including AC tests for some devices. Stop on first fail may be employed.

Step 103 comprises binning the die into a first bin (Bin 1 die) for being a good/passing die for all of probe tests or at least a second bin (Bin 2 die) for failing one or more of the continuity tests and/or parametric tests. There can be more than 2 bins for disclosed embodiments.

Disclosed embodiments include the recognition parametric shifts may occur between probe and final test due to assembly processing which can include some significant thermal processing. A parametric shift study generally specific to a given device and assembly flow may be performed between wafer and package level to determine (quantify) the distribution of the parametric shifts to allow setting of appropriate guard banded limits at probe for the parametric tests performed. To establish this distribution, a completed wafer may be probed, and then the same wafer build into packaged units using the assembly process, and then the packaged units final tested with a full test coverage (i.e., same broad coverage as at probe) final test program, and the distribution of parametric shift determined between probe and final test. Setting of an appropriate guard band at probe for the parametric tests helps enable a disclosed ACHK to avoid passing parametric failures. A typical example probe guardband is about 10% to account for a typical parametric shift resulting from assembly processing.

Disclosed ACHK is package specific and can use a generic Contact Interface Board (CIB), so no device specific test board is needed to implement ACHK. ACHK reduces the handling process and increases productivity compared to conventional final test, with an Overall Equipment Efficiency (OEE) of about 60%, which can be compared an OEE of only about 30% to 40% for conventional final test as disclosed in the Background above. Moreover, as noted above, ACHK performs only simple DC tests including continuity and leakage tests, and minimal DC parametric tests, in a total test time of about 50 ms vs. about 1 sec for conventional final test. Example minimal DC parametric tests include measurement of input current when the device output is low (IIL) and measurement of input current when the device output is high (IIH) for a logic device at a selected device operating condition.

Step 104 comprises dividing the Bin 2 die into a first sub-group that failed the continuity tests and a second sub-group that did not fail the continuity tests. The second sub-group is thus only die that fail the parametric test(s). Some of the die that fail the parametric test(s) may fail due to the probe guardband as described above.

Step 105 comprises triggering the kill die subroutine including applying power sufficient to selectively cause damage to the second sub-group of Bin 2 die to generate a continuity (open/short) failure and thus generate kill die. The damage induced by the kill die treatment is generally damage to any metal or conductor line sufficient to cause an open circuit or short to ground (GND) or short to a neighboring metal line, and/or a gate short (through the gate dielectric) for ICs with MOS devices. The first sub-group of Bin 2 die (continuity failures) does not receive the kill die subroutine, and they may be reprobed.

The applying power can comprise applying electrical power across a terminal/pad combination sufficient to cause an electrical overstress. For this embodiment, the probe needles applying electrical power to induce the electrical overstress may be thickened by at least 50% as compared to the probes on the probe card not performing this function to provide a higher current rating (e.g., sustain≥1 Amp). As noted above no specific device structure is needed on the IC provided the power applied is sufficient.

For probe systems including lasers, the applying power can also comprise applying sufficient laser power to evaporate electrically conductive material to generally cause an open circuit. In the case of a laser, a suitable laser probe system including a laser scanner allows a conductor line (e.g., metal or doped polysilicon) to be cut with a focused laser pulse (e.g., from a carbon dioxide ($CO_2$) laser) which can be used to evaporate a region of the metal or other conductor, and thus disconnect (open) the electrical path by forming a gap in the conductor line lasered. One or more overlying layers (e.g., dielectric passivation) may also be removed by the laser pulse.

The dividing (step 104) and triggering and kill die subroutine (step 105) can be applied after probing each die, and thus before the repeating the contacting, performing, and binning for others of the plurality of die on the substrate (e.g., wafer). In another embodiment the kill die subroutine is applied after all die on the substrate (e.g., wafer) are probed and binned.

As noted above, the method can include re-probe of the Bin 2 first sub-group die (continuity failures), where these Bin 2 die should pass and become Bin 1 die if their continuity failure is a non-genuine/over-rejection typically due to a contact-related problem (e.g., probe misalignment). Reprobing can thus reduce the percentage of Bin 2 die in the first sub-group.

The method can include assembling the Bin 1 die and Bin 2 die into a semiconductor package. Even those die that are determined to be continuity failures (open/short) at probe (Bin 2 first sub-group die) can proceed to packaging because there are some cases of non-genuine continuity rejects, which is one reason to allow Bin 2 first sub-group die to proceed to assembly subsequent package test. There may also be assembly process over-picked/mispick continuity reject die as Bin 1 die. The ACHK test which has full device under test (DUT) pin coverage in pin continuity tests is able to capture the failure when continuity failures are allowed to proceed to subsequent package test.

After probing and then die singulation, assembly follows. In the case the assembly machine (e.g., die pick machine) can cause mispicks where die other than Bin 1 die are picked for assembly so that package test after assembly process can be important. The die pick machine at assembly is intended to pick only good die that mapped on the wafer map. However, older model/legacy die pick machines generally have a lower resolution, which can result in a picking accuracy problem especially when die picking a high density wafer, so that there may be occasions whereby bad die failing continuity or leakage is die picked and then assembled. This is where the killed/bad die generated by a disclosed kill die subroutine at probe is able to be captured by a disclosed ACHK test program that covers continuity (open/short) and only minimal DC parametric package tests.

As noted above, disclosed ACHK test programs include minimal DC parametric tests, such as DC parametric package test for a simple logic device assembled in a leadframe package including input leakage tests (IIL and IIH) and output leakage tests where the wire bonding from the IC die to the lead frame and bonding between pins at assembly is interrogated which is known to cause failures in the case of high leakage. Accordingly, the ACHK test is configured for rapidly (e.g., a total test time of about 50 msec) capturing assembly-generated defects.

Final test can then follow. After contacting the pins of the package using a package test system including a contactor, disclosed embodiments include running a streamlined final test program including a pin continuity test and at most a reduced number of parametric tests compared to parametric tests of the probe tests including only minimal DC parametric tests, wherein the kill die are binned as failures of the pin continuity test. As noted above, the streamlined final test program can be a disclosed ACHK test that only performs the pin continuity tests (to detect opens and shorts) and minimal DC parametric tests of pin-to-pin leakage tests. Such pin continuity and pin-to-pin leakage tests are performed due to assembly process limitations, such as a wire bonding process that can cause variation in contact resistance and package stress.

Advantages of disclosed embodiments include for conventional reduced parametric test coverage at final test, when a wafermap shift happens, there is a possibility that uncovered parametric rejects escape to customers. Using the disclosed kill die approach, killed die at probe ensures parametric rejects escaped from wafermap shift naturally become continuity failures at final package test, allowing pickup by a streamlined final package test such as a disclosed ACHK test which captures kill die as continuity failures. This disclosed method requires bare minimum continuity test to detect parametric rejects escaped from the assembly process.

Advantages of the disclosed kill die approach include minimal final test coverage, where a simple continuity test is capable to screen parametric failures at probe. Test time (e.g., about 50 ms for ACHK as described above) is much lower as compared to a conventional reduced final test solution (e.g., about 1 sec).

Disclosed embodiments include non-transitory machine readable storage media having disclosed code for testing of semiconductor devices stored thereon executable by a processor. The non-transitory machine readable storage media can comprise, for example, random access memory (RAM), read only memory (ROM) and/or magnetic storage media.

EXAMPLES

Disclosed embodiments are further illustrated by the following specific Examples, which should not be construed as limiting the scope or content of this Disclosure in any way.

Figure 2A:
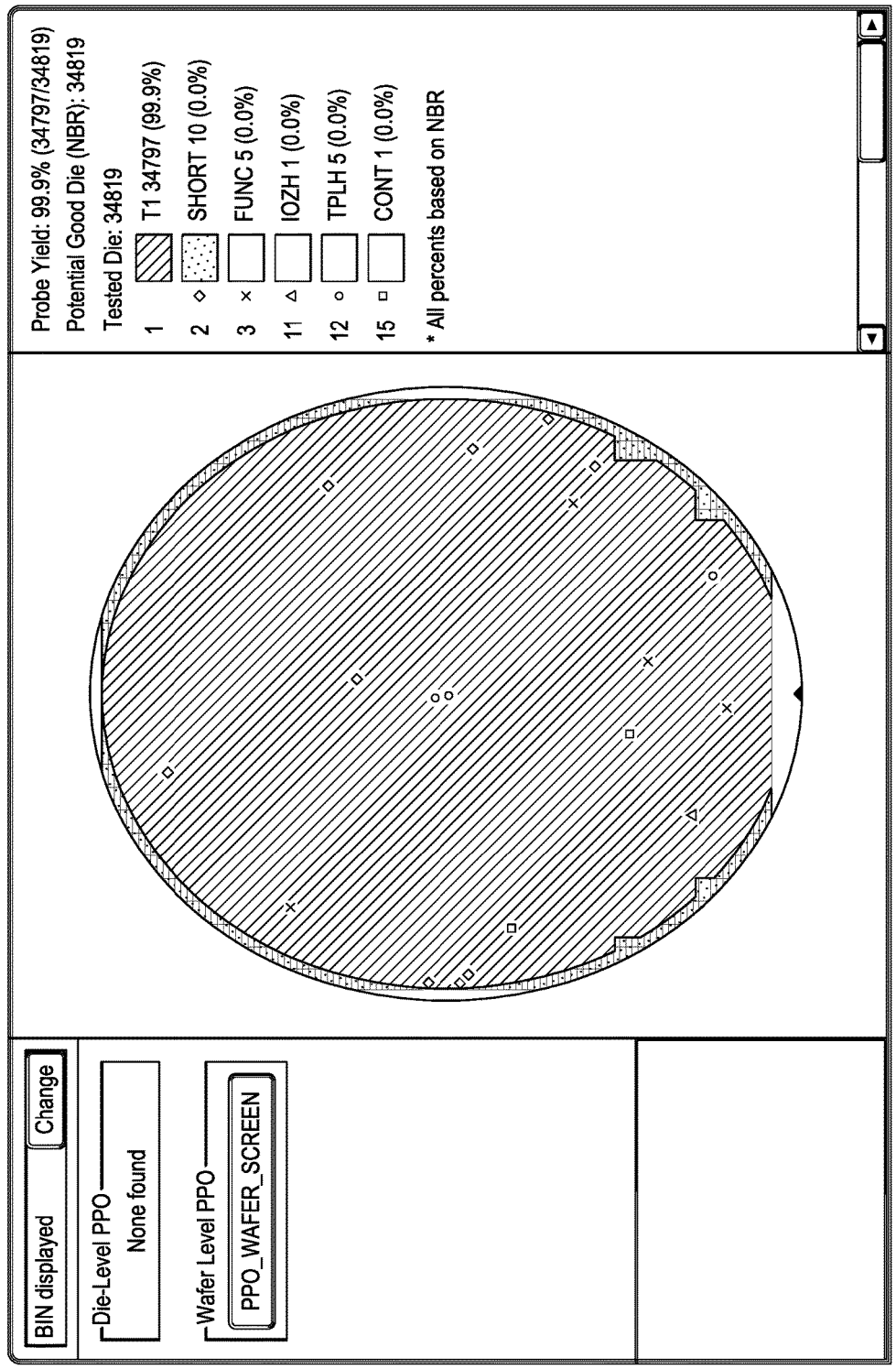
FIG. 2A shows a conventional wafer map obtained by using a standard wafer probe program.

FIG. 2A shows a conventional wafer map obtained by using a standard probe program (no disclosed kill die subroutine). Although 99.9% of the die on the wafer are shown passing (Bin 1 die), some of the passing die will likely shift out of specification once they are packaged and can become field failures.

Figure 2B:
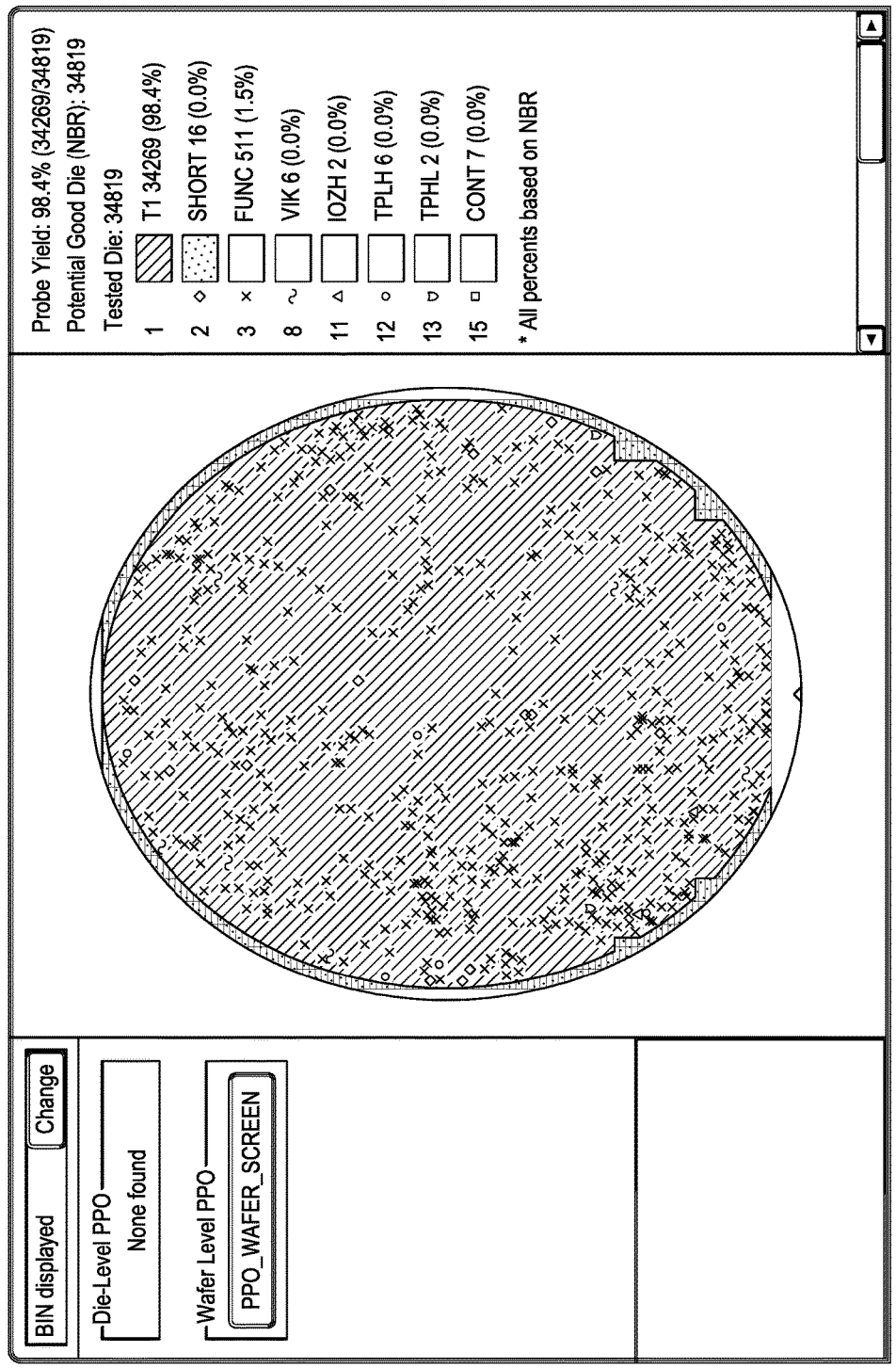
FIG. 2B shows a wafer map obtained by using a wafer probe program including a disclosed kill die subroutine, according to an example embodiment.

FIG. 2B shows a wafer map obtained from the same wafer described in FIG. 2A by using a wafer probe program including a disclosed kill die subroutine, according to an example embodiment. High electrical power was applied across pads corresponding to pins 1 and 13 of the package for this device to target an ESD diode on the die for all parametric failing die. Although 98.4% of the die on the wafer are shown passing (Bin 1 die) in FIG. 2B, all rejects as a result of kill die processing are shown failing continuity (open and/or short). Failure analysis (FA) on special work request (SWR) rejects revealed the kill die signature (failing pads corresponding to pin #1 and 13), evidencing the disclosed kill die subroutine worked to produce the 1.5% continuity failures.

Disclosed embodiments can be used to test a variety of different IC devices and related products. The IC die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the IC die can be formed from a variety of processes including bipolar, CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

What is claimed is:

1. A method of manufacturing, comprising:
probing a wafer having integrated circuit dies using a probe system;
detecting a parametric failure in at least a first one of the integrated circuit dies and a parametric passing in at least a second one of the integrated circuit dies;
generating, using the probe system, a continuity failure based on the detected parametric failure in the first one of the integrated circuit dies before performing a continuity test; and
assembling the second one of the integrated circuit dies into a semiconductor package.

2. The method of claim 1, wherein the generating the continuity failure includes applying electrical power to the first one of the integrated circuit dies to cause an electrical overstress on the first one of the integrated circuit dies.

3. The method of claim 1, wherein the generating the continuity failure includes inducing a damage to a conductive line of the first one of the integrated circuit dies.

4. The method of claim 1, wherein the generating the continuity failure includes applying laser power to evaporate a conductive material of the first one of the integrated circuit dies.

5. The method of claim 1, wherein the generating the continuity failure includes inducing a damage to a dielectric layer of the first one of the integrated circuit dies.

6. The method of claim 1, further comprising:
discarding the first one of the integrated circuit dies before assembling the second one of the integrated circuit dies into the semiconductor package.

7. The method of claim 1, further comprising:
assembling the first one of the integrated circuit dies into a second semiconductor package; and
detecting the continuity failure in the first one of the integrated circuit dies assembled in the second semiconductor package.

8. A method of manufacturing, comprising:
detecting a parametric failure in a first integrated circuit die from a wafer and a parametric passing in a second integrated circuit die from the wafer;
generating, using the probe system, a continuity failure based on the detected parametric failure in the first integrated circuit die before performing a continuity test;
singulating the first integrated circuit die and the second integrated circuit die from the wafer; and
assembling the second integrated circuit die into a semiconductor package.

9. The method of claim 8, wherein the generating the continuity failure includes applying electrical power to the first integrated circuit die to cause an electrical overstress on the first integrated circuit die.

10. The method of claim 8, wherein the generating the continuity failure includes inducing a damage to a conductive line of the first integrated circuit die.

11. The method of claim 8, wherein the generating the continuity failure includes applying laser power to evaporate a conductive material of the first integrated circuit die.

12. The method of claim 8, wherein the generating the continuity failure includes inducing a damage to a dielectric layer of the first integrated circuit die.

13. The method of claim 8, further comprising:
discarding the first one of the integrated circuit die before assembling the second integrated circuit die into the semiconductor package.

14. The method of claim 8, further comprising:
assembling the first integrated circuit die into a second semiconductor package; and
detecting the continuity failure in the first integrated circuit die assembled in the second semiconductor package.

15. A method of manufacturing, comprising:
detecting a parametric failure in a first integrated circuit die and a second integrated circuit die from a wafer;
generating, using the probe system, a continuity failure based on the detected parametric failure in each of the first integrated circuit die and the second integrated circuit die before performing a continuity test;
discarding the first integrated circuit die;
assembling the second integrated circuit die into a semiconductor package; and
detecting the continuity failure in the second integrated circuit die assembled in the semiconductor package.

16. The method of claim 15, wherein the generating the continuity failure includes applying electrical power to the first integrated circuit die to cause an electrical overstress on each of the first integrated circuit die and the second integrated circuit die.

17. The method of claim 15, wherein the generating the continuity failure includes inducing a damage to a conductive line of each of the first integrated circuit die and the second integrated circuit die.

18. The method of claim 15, wherein the generating the continuity failure includes applying laser power to evaporate a conductive material of each of the first integrated circuit die and the second integrated circuit die.

19. The method of claim 15, wherein the generating the continuity failure includes inducing a damage to a dielectric layer of each of the first integrated circuit die and the second integrated circuit die.

20. The method of claim 15, further comprising:
singulating the first and second integrated circuit dies from the wafer.

* * * * *